United States Patent [19]
Goronkin et al.

[11] Patent Number: 4,769,683
[45] Date of Patent: Sep. 6, 1988

[54] SUPERLATTICE GATE FIELD EFFECT TRANSISTOR

[75] Inventors: Herbert Goronkin, Scottsdale; George N. Maracas, Tempe, both of Ariz.; Richard Nguyen, San Diego, Calif.

[73] Assignee: Motorola Inc., Schaumburg, Ill.

[21] Appl. No.: 64,629

[22] Filed: Jun. 22, 1987

[51] Int. Cl.⁴ .............................................. H01L 27/12
[52] U.S. Cl. ...................................... 357/4; 357/23.7; 357/23.14
[58] Field of Search .................. 357/4 SL, 23.7, 23.14

[56] References Cited

U.S. PATENT DOCUMENTS

| | | | |
|---|---|---|---|
| 4,194,935 | 3/1980 | Dingle | 357/4 |
| 4,503,447 | 3/1985 | Iafrate | 357/4 |
| 4,503,540 | 3/1985 | Nakashima | 357/4 |
| 4,642,144 | 2/1987 | Tiedje | 357/4 |
| 4,644,373 | 2/1987 | Williams | 357/4 |

OTHER PUBLICATIONS

Cole, *Electronics*, Apr. 28, 1986.

*Primary Examiner*—Martin H. Edlow
*Attorney, Agent, or Firm*—Joe E. Barbee

[57] ABSTRACT

A quasi 1-dimensional electron gas transistor has been provided having a source electrode and a drain electrode. A plurality of electrodes are positioned between the source and drain electrodes in a manner which are parallel to the electron flow between the source and the drain electrodes. In one embodiment, the electrodes are interconnected by a gate electrode while in an alternate embodiment all the electrodes are connected to the source electrode and insulated from the gate electrode. This device provides a quantum wire for quasi 1-dimensional electron flow.

7 Claims, 1 Drawing Sheet

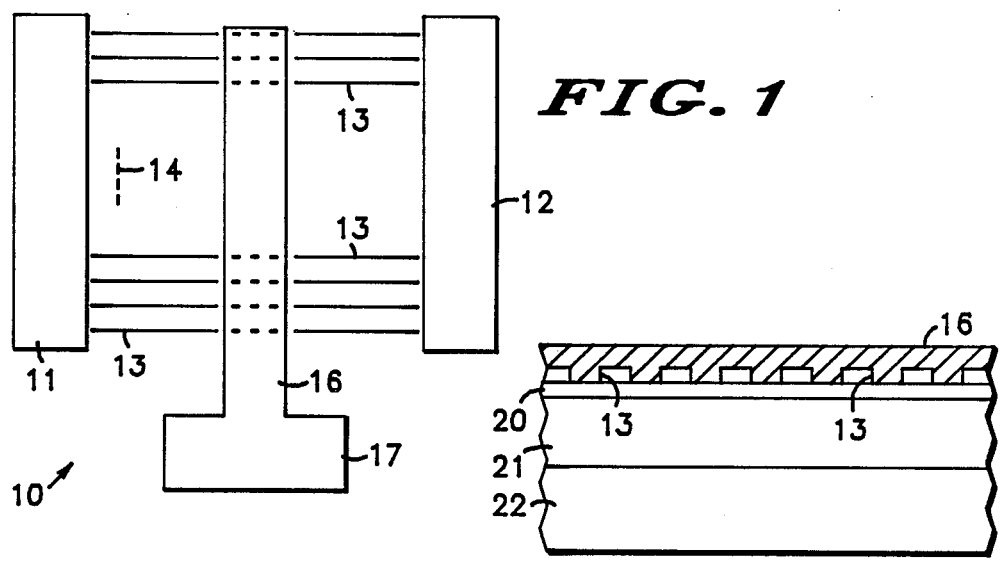
FIG. 1
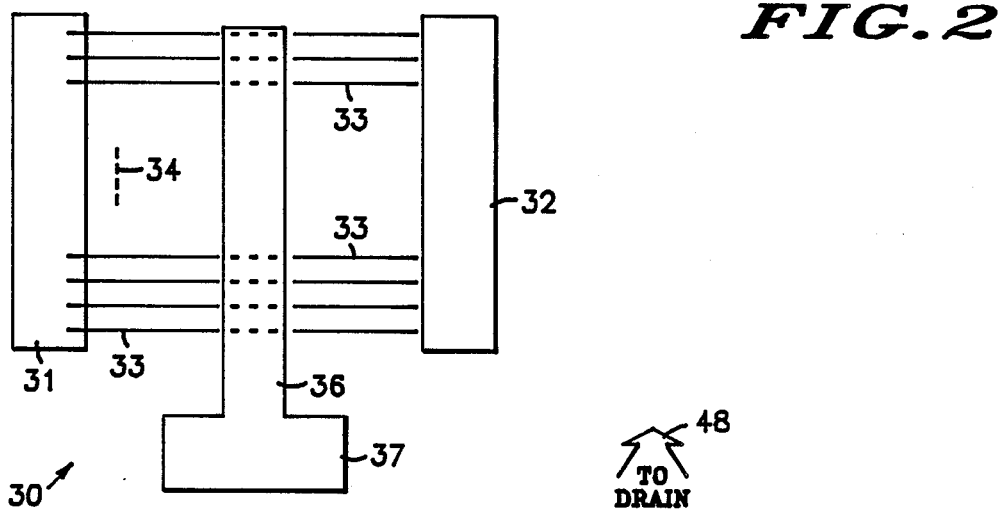
FIG. 2
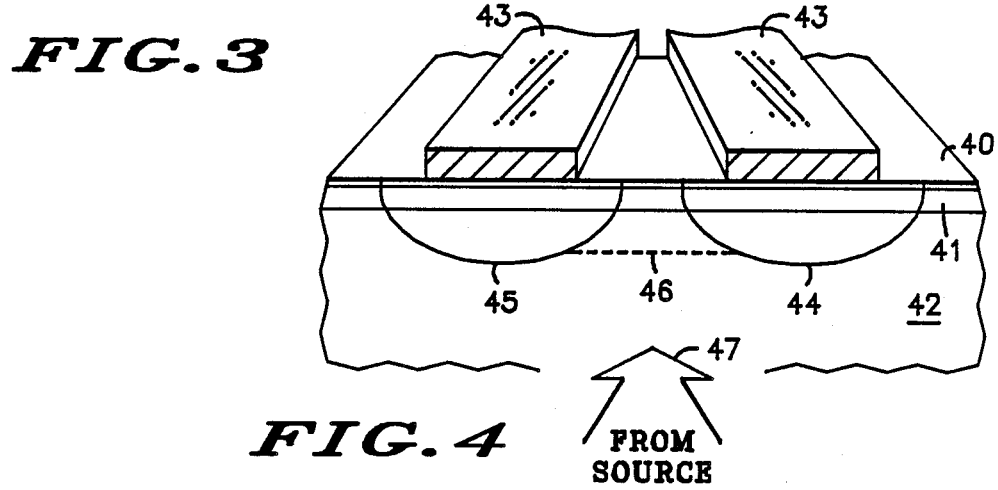
FIG. 3
FIG. 4

4,769,683

SUPERLATTICE GATE FIELD EFFECT TRANSISTOR

BACKGROUND OF THE INVENTION

This invention relates, in general, to III-V semiconductors, and more particularly, to a superlattice gate field effect transistor.

It is generally recognized that semiconductor-based multilayered superlattice and quantum-well structures offer the promise of high density integrated circuits. One such device is disclosed in U.S. Pat. No. 4,503,447 which issued to Iafrate et al. This U.S. patent also lists several prior patents which describe superlattice structures and methods for making the same. Accordingly, U.S. Pat. No. 4,503,477 is incorporated herein by reference. In addition to small size these structures offer new device possibilities having increased speed.

Accordingly, it is an object of the present invention to provide an improved superlattice gate heterostructure field effect transistor.

Another object of the present invention is to provide a superlattice gate field effect transistor having increased device speed and increased transconductance.

Yet a further object of the present invention is to provide a field effect transistor having gate electrodes aligned in the direction of current flow so electrons can achieve quasi 1-dimensional behavior providing significantly enhanced mobility and velocity.

SUMMARY OF THE INVENTION

The above and other objects and advantages of the present invention are achieved by providing a superlattice gate field effect transistor having a source and a drain. A plurality of electrodes are arranged parallel to each other between the source and the drain. The electrodes are arranged so that electron flow will occur in a direction parallel to the alignment of the electrodes. The electrodes form the superlattice gate structure. In operation, the electrodes form a 1-dimensional channel between depletion regions for electrons to flow.

BRIEF DESCRIPTION OF THE DRAWINGS

FIG. 1 is a skeleton representation of one embodiment of the present invention;

FIG. 2 is a cross section of a portion of the structure of FIG. 1 that illustrates the connection to the gate structure;

FIG. 3 represents, in a skeleton form, an alternate embodiment of the present invention; and FIG. 4 is an enlarged view of a very small portion of the present invention.

DETAILED DESCRIPTION OF THE DRAWINGS

The category of structures that appear to have the capability to take semiconductor device sizes down below a half micron is superlattice structures. A superlattice structure is one that has a periodic lattice of some sort that is fabricated on top of or within a solid that has in itself a periodic lattice. Typical superlattice periods are generally 10 to 100 times larger than the period of the crystal lattice. A superlattice structure can be one having vertical switching elements consisting of multiple layers each perhaps only a few atoms thick. As an example, in GaAs the average spacing between atomic planes is about 5 angstroms; this provides a periodic lattice in all directions. The preferred structure will provide 1-dimensional electron flow in a quantum wire. The wave length of an electron is approximately 100 angstroms for an electron energy of about 0.2 electron volt and therefore the quantum wire has to be large enough to accommodate one electron. One dimension means that if the wire is only one electron wide then electrons will only move in one direction. The mobility of electrons in one dimension is much higher than the mobility of electrons flowing in two or three dimensions since scattering only through an angle of 180° is allowed. As will be apparent hereinafter, a 1-dimensional channel is achieved by using depletion areas. However, a 1-dimensional channel can become a two dimensional channel if the depletion areas are not present. More current can flow in a two dimensional channel; however, there will be less current density and therefore less current gain. The higher the energy level of the electron the smaller the wave length. A 100 millivolt electron means that in GaAs the electron would be about 4 times hotter than at room temperature and would therefore give a wave length of approximately 150 angstroms.

FIG. 1 illustrates in skeleton form a 1-dimensional field effect transistor 10. FIG. 1 is a skeleton plan view of field effect transistor 10 having a source electrode 11, a drain electrode 12, and a plurality of electrodes extending between source 11 and drain 12 and illustrated as lines 13. Typically there could be anywhere from ten to more than 100 1-dimensional channel guide electrodes 13. Dots 14 are used to illustrate the continuation of electrodes 13 which are not shown for clarity of the drawing. Electrodes 13 are interconnected by interconnect means 16 which is attached to a gate contact pad 17. As will become more apparent hereinafter electrons flow from source 11 to drain 12 in between 1-dimensional channel guide electrodes 13.

FIG. 2 illustrates a small portion of a cross-section of the structure of FIG. 1 wherein the cross-section is taken along interconnecting means 16. Interconnect 16 is physically connected to each electrode 13. In the example illustrated in FIG. 2, electrodes 13 are on top of GaAs layer 20. Below GaAs layer 20 is an aluminum GaAs (AlGaAs) layer 21 which in a preferred embodiment, is undoped nearest layer 20 with the remainder being heavily doped N-type except for the spacer layer. The spacer layer is used to reduce scattering of electrons in the conducting channel by the electric field of the donor atoms. It will be understood that the spacer layer is not universally desirable, as an example, when it is more advantageous that the carriers in the channel have high concentration rather than high mobility the spacer layer may be omitted. Below AlGaAs layer 21 is an undoped GaAs layer 22. Layer 20 is a capping layer which is used to protect AlGaAs layer 21 from oxidizing and also makes good ohmic contacts for the source and drain electrodes after the source and drain areas are suitably doped. Electrodes 13 can be made from aluminum, an alloy, or as a layered structure such as titanium, platinum and gold, or the like. In a preferred embodiment, it is preferred to omit capping layer 20 directly underneath electrodes 13 to prevent current from flowing directly underneath the electrodes. Capping layer 20 is not really needed underneath electrodes 13 since oxidized AlGaAs will not impair the capacitive coupling of the 1-dimensional channel guide electrodes 13. The resistivity of the AlGaAs is lower than that of the undoped GaAs layer 22 and by appropriate choice of layer thickness electrons will flow in the undoped GaAs layer 22 and not in the AlGaAs.

FIG. 3 is a skeleton plan view of an alternate embodiment of the structure of FIG. 1. 1-dimensional field effect transistor 30 has source electrode 31, drain electrode 32, and a plurality of electrodes 33 positioned between source 31 and drain 32. Dotted lines 34 indicate that all the electrodes 33 are not illustrated. One difference between the structure of FIG. 3 and that of FIG. 1 is that electrodes 33 in FIG. 3 are connected to source electrode 31. The other difference is that electrodes 33 are not interconnected by member 36. Member 36 serves as a gate electrode which is connected to gate electrode contact pad 37. Gate electrode 36 is insulated from electrodes 33 by any suitable means such as oxide or the like.

The operation of the structures of FIGS. 1 and 3 can be better understood by the enlarged model presentation illustrated in FIG. 4. FIG. 4 illustrates a very small portion of a 1-dimensional field effect transistor. FIG. 4 illustrates only two 1-dimensional channel guide electrodes 43 which appear on top of GaAs capping layer 40. Beneath layer 40 is an N-type doped AlGaAs layer 41. Below layer 41 is a GaAs layer 42. As those persons of skill in the art will appreciate, doped layer 41 may have an undoped spacer area adjacent to undoped layer 42. This well known technique is called modulation doping and is chosen to provide the desired operating characteristics of the completed device. When the device of FIG. 4 is properly biased, each electrode 43 will have a depletion area as illustrated by depletion areas 44 and 45. Arrows 47 and 48 are used to illustrate the electron flow from the source electrode to the drain electrode. Dotted line 46 illustrates the lower perimeter of the 1-dimensional electron channel formed by this device. In a typical device, dotted line 46 is typically 80 angstroms below doped layer 41. The 1-dimensional electron channel is defined by dotted line 46, the edges of depletion layers 44 and 45, and by layer 41. This 1-dimensional electron channel forms the quantum wire. As the concentration of donors in the AlGaAs increases, the depletion layers move apart since there will be less penetration into the substrate because there will be more charge underneath electrodes 43. Therefore proper selection of dopant densities will help determine what the channel openings will be. The voltage applied to electrodes 43 will control the depth and lateral extent of the depletion regions 44 and 45. In otherwords, the voltage supplied to electrodes 43 will change the size and shape of the potential wells. If depletion areas 44 and 45 become very small then the electron flow will be a 2-dimensional electron flow.

Thermally generated noise is a function of the number of degrees of freedom in a semiconductor device. In a 3-dimensional electron flow device noise is very high. As an example in a MODFET, which has only two degrees of freedom the noise is much lower; and in a 1-dimensional device there is only one degree of freedom and therefore one-half the noise as in a MODFET device.

By now it should be appreciated that there has been provided a unique quasi 1-dimensional electron gas transistor. This transistor is easy to construct using known procedures and results in high speed and high gain. Even though the present invention has been explained using N-type dopants it will be understood that P-type dopants could be used. Also the invention is applicable to other III-V compounds.

We claim:

1. A superlattice gate field effect transistor comprising: a source; a drain; and a plurality of 1-dimensional channel guide electrodes arranged in a parallel configuration between the source and drain, wherein any electron flow between the source and drain is parallel to the 1-dimensional channel guide electrodes.

2. The superlattice gate field effect transistor of claim 1 wherein the plurality of 1-dimensional channel guide electrodes are all interconnected by a transverse member.

3. The superlattice gate field effect transistor of claim 1 wherein the plurality of 1-dimensional channel guide electrodes are all connected to the source, and further including a single gate electrode positioned over and insulated from the plurality of 1-dimensional channel guide electrodes and being transverse to the plurality of 1-dimensional channel guide electrodes.

4. A superlattice gate III-V compound field effect transistor comprising a source electrode; a drain electrode; and a plurality of electrodes positioned between the source and the drain wherein a first end of each of the plurality of electrodes is near the source and a second end of each of the plurality of electrodes is near the drain.

5. The superlattice gate III-V compound field effect transistor of claim 4 further including a connecting member to interconnect the plurality of electrodes to form a gate electrode.

6. The superlattice gate III-V compound field effect transistor of claim 4 wherein the plurality of electrodes all have their first end connected to the source, and further including a member transverse to and isolated from the plurality of electrodes to form a gate electrode.

7. A superlattice gate field effect transistor comprising a source electrode; a drain electrode; and a plurality of electrodes located between the source electrode and the drain electrode to form the superlattice gate, wherein 1-dimensional electron channel is formed between the plurality of electrodes during operation of the field effect transistor so electrons can flow between the source electrode and the drain electrode in the 1-dimensional electron channel.

* * * * *